(12) United States Patent
Beyer et al.

(10) Patent No.: US 7,508,276 B2
(45) Date of Patent: Mar. 24, 2009

(54) FREQUENCY MODULATOR

(75) Inventors: Sascha Beyer, Ottendorf-Okrilla (DE); Rolf Jaehne, Ottendorf-Okrilla (DE)

(73) Assignee: Atmel Germany GmbH, Heilbronn (DE)

( * ) Notice: Subject to any disclaimer, the term of this patent is extended or adjusted under 35 U.S.C. 154(b) by 43 days.

(21) Appl. No.: 11/785,028

(22) Filed: Apr. 13, 2007

(65) Prior Publication Data
US 2007/0252654 A1    Nov. 1, 2007

(30) Foreign Application Priority Data
Apr. 13, 2006    (DE)    ........................ 10 2006 017 973

(51) Int. Cl.
*H03L 7/00* (2006.01)
(52) U.S. Cl. ............................. 331/16; 331/17; 331/34; 332/127
(58) Field of Classification Search ............. 331/16–17, 331/34, 177 V; 332/127–128
See application file for complete search history.

(56) References Cited

U.S. PATENT DOCUMENTS 4,074,209 A    2/1978    Lysobey (Continued)

FOREIGN PATENT DOCUMENTS

DE    199 29 167 A1    12/2000

(Continued)

OTHER PUBLICATIONS

"Automatic Calibration of Modulated Frequency Synthesizers," by Daniel R. McMahill and Charles G. Sodini published in the technical journal, "IEEE Transactions on Circuits and Systems-II: Analog and Digital Signal Processing," vol. 49, No. 5, May 2002, pp. 301-311.

(Continued)

*Primary Examiner*—Anh Q Tran
(74) *Attorney, Agent, or Firm*—Muncy, Geissler, Olds & Lowe, PLLC (57) ABSTRACT

A frequency modulator is provided for generating an output signal with a frequency that is a function of a modulation signal, wherein the modulation signal can assume $N \geq 2$ different discrete modulation values, and a predetermined frequency value of the output signal is associated with each modulation value, containing: a) a closed phase locked loop with a loop filter for providing a first control voltage, with a voltage controlled oscillator for generating the output signal, and with a switchable frequency divider for deriving a frequency-divided signal, and b) a modulation unit that is designed to provide, at a first output, values of a divisor that are a function of the modulation signal, and at a second output, a second control voltage that is a function of the modulation signal, c) wherein the oscillator has a first control input connected to the loop filter and has a second control input connected to the second output of the modulation unit, and is designed to generate the output signal as a function of the first control voltage and the second control voltage, d) and wherein the frequency divider is connected to the first output of the modulation unit and is designed to derive the frequency-divided signal in such a manner that it has instantaneous frequencies that are a function of the divisor values. According to the invention, the modulation unit has a capacitive voltage divider with a center tap and is designed to provide the second control voltage at the center tap. The invention further concerns a transmitting/receiving device and an integrated circuit having such a frequency modulator.

20 Claims, 3 Drawing Sheets

U.S. PATENT DOCUMENTS

| | | | | |
|---|---|---|---|---|
| 4,313,209 A | * | 1/1982 | Drucker | 455/112 |
| 4,743,867 A | | 5/1988 | Smith | |
| 5,983,077 A | | 11/1999 | Dent | |
| 6,844,763 B1 | | 1/2005 | Balboni | |
| 2003/0043950 A1 | * | 3/2003 | Hansen et al. | 375/376 |
| 2005/0104669 A1 | | 5/2005 | Herzinger et al. | |

FOREIGN PATENT DOCUMENTS

WO     WO 00/55973     9/2000

OTHER PUBLICATIONS

"A 43 mW Bluetooh Transceiver with -91 dBm Sensitivity" by Christian Cojocaru et al., which appeared in the conference proceedings of the "2003 IEEE International Solid-State Circuits Conference," on pp. 64, 65 and 432.

Tietze U. Schenk, "Compensated Voltage Divider", vol. 6, Berlin, Springer 1983.

* cited by examiner

FREQUENCY MODULATOR

This nonprovisional application claims priority under 35 U.S.C. § 119(a) to German Patent Application No. DE 102006017973, which was filed in Germany on Apr. 13, 2006, and which is herein incorporated by reference.

BACKGROUND OF THE INVENTION

1. Field of the Invention

The present invention relates to a frequency modulator and to a transmitting/receiving device and an integrated circuit having such a device.

2. Description of the Background Art

The invention resides in the field of discrete frequency modulators for transmitting/receiving devices in communications systems. Such frequency modulators generate an output signal with an instantaneous frequency that is a function of an n-level modulation signal, wherein the modulation signal can assume $N \geq 2$ different discrete modulation values, and a predetermined frequency value of the output signal is associated with each modulation value.

The invention resides more particularly in the field of so-called direct modulating frequency modulators, which generate the output signal as part of frequency synthesis. It resides, furthermore, more particularly in the field of so-called "closed loop" frequency modulators, whose phase locked loop (PLL) is closed even during modulation.

A direct modulating frequency modulator with a closed phase locked loop is known from the article entitled, "Automatic Calibration of Modulated Frequency Synthesizers," by Daniel R. McMahill and Charles G. Sodini published in the technical journal, "IEEE Transactions on Circuits and Systems—II: Analog and Digital Signal Processing," Vol. 49, No. 5, May 2002, pages 301-311. In this connection, the PLL synthesizer is modulated in that the divisor of the frequency divider in the feedback path of the phase locked loop is varied as a function of the modulation signal.

The modulation bandwidth, which is to say the maximum possible rate of the modulation signal, is limited by the bandwidth of the closed phase locked loop with such an approach, however. Larger modulation bandwidths are made possible by providing a digital preemphasis filter whose transfer function must precisely match the inverse transfer function of the PLL (see section II.C and, in particular, FIG. 3 of the article). In order to achieve this matching, the cited article proposes an automatic calibration unit that controls the current in the charge pump as a function of the output signal of the voltage controlled oscillator (VCO) and of the modulation signal (see section III and, in particular, FIG. 4). A disadvantage here is the complexity of the calibration algorithm and the associated high complexity of implementing the calibration unit (see section IV and, in particular, FIGS. 7, 14, 17, 18 and 20). Furthermore, the high consumption of operating energy associated with the high implementation complexity is disadvantageous. Moreover, the calibration unit itself requires a disadvantageous dead time before establishment of calibration as a result of time delay elements (phase accumulators, filters, integrators, etc.).

Another direct modulating frequency modulator with a closed phase locked loop is known from the article, "A 43 mW Bluetooth Transceiver with −91 dBm Sensitivity" by Christian Cojocaru et al., which appeared in the conference proceedings of the "2003 IEEE International Solid-State Circuits Conference," on pages 64, 65 and 432. Here, too, the PLL synthesizer is modulated in that the divisor of the frequency divider in the feedback path is varied as a function of the modulation signal. Moreover, the modulation signal is filtered and is fed to a second control input of the oscillator through a digital-to-analog converter. A disadvantage here is the increased implementation complexity, particularly due to the filter and the two analog-to-digital converters, as well as the increased energy consumption associated therewith. Moreover, the frequency change per unit time of the output signal is relatively small.

SUMMARY OF THE INVENTION

It is therefore an object of the present invention to provide a frequency modulator that is simple to implement, can be operated in an energy-saving manner, and permits rapid and precise frequency change and higher-rate modulation signals, so that high performance transmitting/receiving devices can be implemented and operated in a simple, cost-effective and energy-efficient manner.

The inventive frequency modulator for generating an output signal with a frequency that is a function of a modulation signal, wherein the modulation signal can assume $N \geq 2$ different discrete modulation values, and a predetermined frequency value of the output signal is associated with each modulation value, contains:

a closed phase locked loop with a loop filter for providing a first control voltage, with a voltage controlled oscillator for generating the output signal, and with a switchable frequency divider for deriving a frequency-divided signal, and a modulation unit that is designed to provide, at a first output, values of a divisor that are a function of the modulation signal, and at a second output, a second control voltage that is a function of the modulation signal, wherein the oscillator has a first control input connected to the loop filter and has a second control input connected to the second output of the modulation unit, and is designed to generate the output signal as a function of the first control voltage and the second control voltage, wherein the frequency divider is connected to the first output of the modulation unit and is designed to derive the frequency-divided signal in such a manner that it has instantaneous frequencies that are a function of the divisor values, and wherein the modulation unit has a capacitive voltage divider with a center tap and is designed to provide the second control voltage at the center tap.

The inventive transmitting/receiving device and the inventive integrated circuit each can have such a frequency modulator.

An aspect of the invention is to shorten a period during which the second control voltage changes from a first voltage value that is associated with a first modulation value to a second voltage value that is associated with a second modulation value. This is achieved in accordance with the invention in that a defined current is added to or removed from the center tap of the voltage divider by means of a capacitive voltage divider. As a result of this easy-to-implement solution that can be operated in an energy-saving manner, the transition period (transient process) of the second control voltage from the first voltage value to the second value is drastically reduced, so that, in advantageous fashion, frequency change can be carried out more rapidly and more precisely, and higher-rate modulation signals can also be processed.

In an embodiment, the modulation unit has a resistive voltage divider whose center tap is connected to the center tap of the capacitive voltage divider. Preferably, the capacitive and resistive voltage dividers each have a high point that is at the same voltage. By this means, the static operating point for the capacitive element of the voltage-controlled oscillator, which is controlled by the second control voltage, is advantageously established.

In another embodiment, the capacitive voltage divider has a first capacitive element located between the center tap and a reference point, and a second capacitive element located between the center tap and a high point of the capacitive voltage divider, wherein preferably a first resistive element is connected in parallel to the first capacitive element and a second resistive element is connected in parallel to the second capacitive element. Such a frequency modulator is especially simple to implement.

In an embodiment, the first capacitive and first resistive elements and/or the second capacitive and second resistive elements have an adjustable value and the modulation unit has a conversion unit that is designed to adjust the adjustable values as a function of the applicable current value of the modulation signal. In addition to rapid frequency changes, this adjustability of the values also advantageously permits the frequency swing of the modulator to be adjusted or calibrated.

In an embodiment, the modulation unit has, connected to a high point of the capacitive voltage dividers, a conversion unit that is designed to associate a predefined voltage value with each modulation value, and to apply to the high point the particular voltage value that is associated with the applicable current value of the modulation signal. Such a frequency modulator is especially simple to implement.

In another embodiment, the oscillator has a first and a second frequency-determining capacitive element with an adjustable first or second capacitance value and the frequency modulator is designed to adjust the first capacitance value on the basis of the first control voltage, and to adjust the second capacitance value on the basis of the second control voltage. Preferably, the oscillator is designed to convert the first and second control voltages with different slopes. In this way, the requirements for the accuracy of the components of the capacitive voltage divider are advantageously reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Unless otherwise indicated, like and functionally like elements and signals are labeled with identical reference symbols in the figures.

Figure 1:
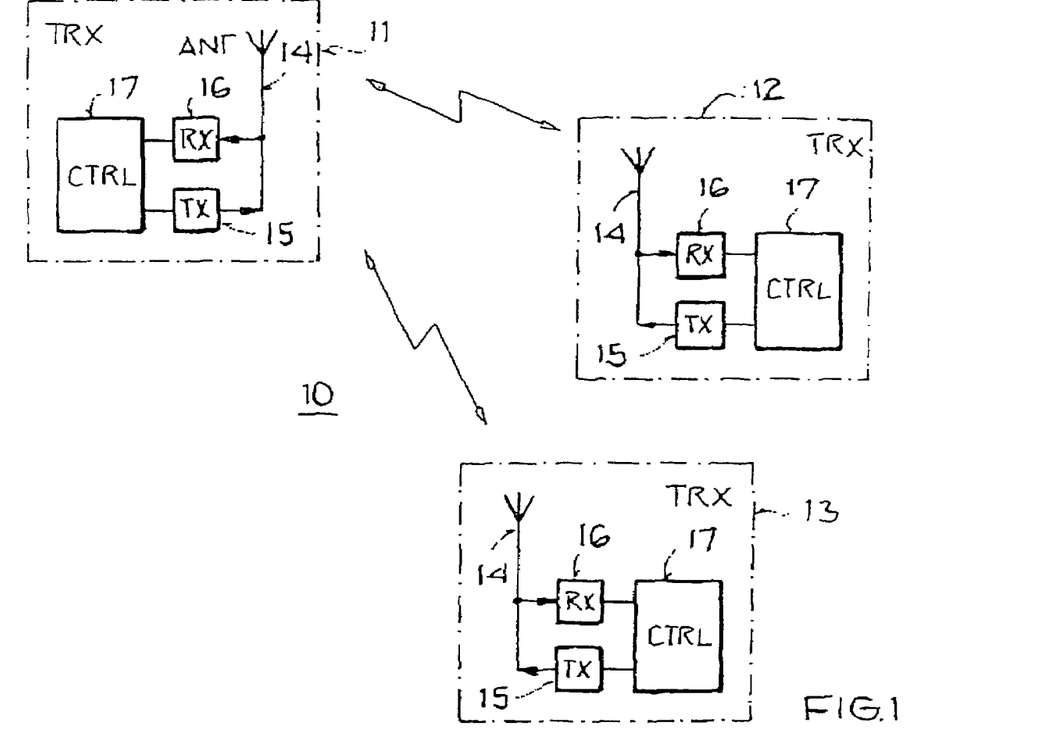
FIG. 1 illustrates an example of a Wireless Personal Area Network (WPAN) per IEEE 802.15.4 with inventive transmitting/receiving devices.

So-called "Wireless Personal Area Networks" (WPAN) may be used for wireless transmission of information over relatively short distances. FIG. 1 shows an example of a WPAN 10 per IEEE Standard 802.15.4. This standard specifies low-rate WPANs which, with raw data rates of up to 250 kbit/s and fixed-position or mobile devices, are suitable for applications in industrial monitoring and control, in sensor networks, in automation, as well as in the field of computer peripherals and for interactive games. The ability to implement the devices very simply and economically is critical for such applications, as is an extremely low power requirement. Hence, this standard aims for battery lifetimes of several months to several years.

The WPAN shown in FIG. 1 includes three transmitting/receiving devices (transceiver, TRX) 11-13 in the form of stationary or mobile devices that wirelessly exchange information by means of radio signals. The transmitting/receiving device 11 is what is known as a full-function device, which assumes the function of the WPAN coordinator, while the transmitting/receiving devices 12, 13 are so-called limited function devices, which are associated with the full-function device 11 and can exchange data only with it. In addition to the star-shaped network topology shown in FIG. 1, in which bidirectional data transmission can occur only between one of the limited function devices 12, 13 at a time and the full-function device 11, but not between the limited function devices 12, 13, the standard also provides what are called peer-to-peer topologies, in which every full-function device can communicate with every other full-function device.

The transmitting/receiving devices 11-13 are each composed of an antenna 14, a transmitting unit (transmitter, TX) 15 associated with the antenna, a receiving unit (receiver, RX) 16 associated with the antenna, and a control unit (control unit, CTRL) 17 associated with the transmitting and receiving units for controlling the same. In addition, the transmitting/receiving devices 11-13 each include a power supply unit (not shown in FIG. 1) in the form of a battery or the like to supply energy to the units 15-17, as well as possible additional components (sensors, interfaces, actuators, etc.).

The explanation below assumes that the data transmission takes place in the ISM (industrial, scientific, medical) band at 2.4 GHz. In this frequency band, IEEE Standard 802.15.4 specifies a total of 16 channels at 5 MHz intervals, with the center frequencies fCH of the channels located at 2405, 2410, . . . , 2480 MHz. For raw data rates of fB=250 kbit/s, a band spread (spreading) with a chip rate of fC=2 Mchip/s and offset QPSK modulation (quaternary phase shift keying) with half-sine pulse shaping is specified in these channels.

The transmitting unit 15 of each transmitting/receiving device converts the data stream to be transmitted in each case into a radio signal for radiation through its antenna 14 in that the data stream to be transmitted is first converted per IEEE 802.15.4 into four-bit-wide symbols, and these are converted into consecutive PN sequences (pseudo noise) of 32 chips each. The chips of the consecutive PN sequences are then offset QPSK modulated, spectrally shifted into one of the 16 channels of the ISM band, and finally amplified for transmission. Since offset QPSK modulation with half-sine pulse shaping corresponds to MSK modulation (minimum shift keying), which is to say FSK modulation (frequency shift keying) with modulation index ½ or frequency swing $\Delta F = fC/$ $\Delta f = 0.5$ MHz, the modulator in the transmitting unit 15 can be implemented as a frequency modulator.

The receiving unit 16 of each transmitting/receiving device converts a radio signal—received by its antenna 14 and generated per IEEE 802.15.4 by the transmitting unit of a different transmitting/receiving device—into the transmitted data in as error-free a manner as possible in that the received radio signal is amplified, spectrally shifted, and demodulated, and finally the data are detected (decided).

The transmitting unit 15 and the receiving unit 16 of a transmitting/receiving device here are part of an integrated circuit (not shown in FIG. 1), for example of an ASIC (application specific integrated circuit) or of an ASSP (application specific standard product), while the control unit 17 is implemented as a microcontroller (likewise not shown). Advantageously, the transmitting/receiving device has only one integrated circuit implemented as, for example, an ASIC, which performs the functions of the transmitting unit 15, the receiving unit 16, and the control unit 17.

Figure 2:
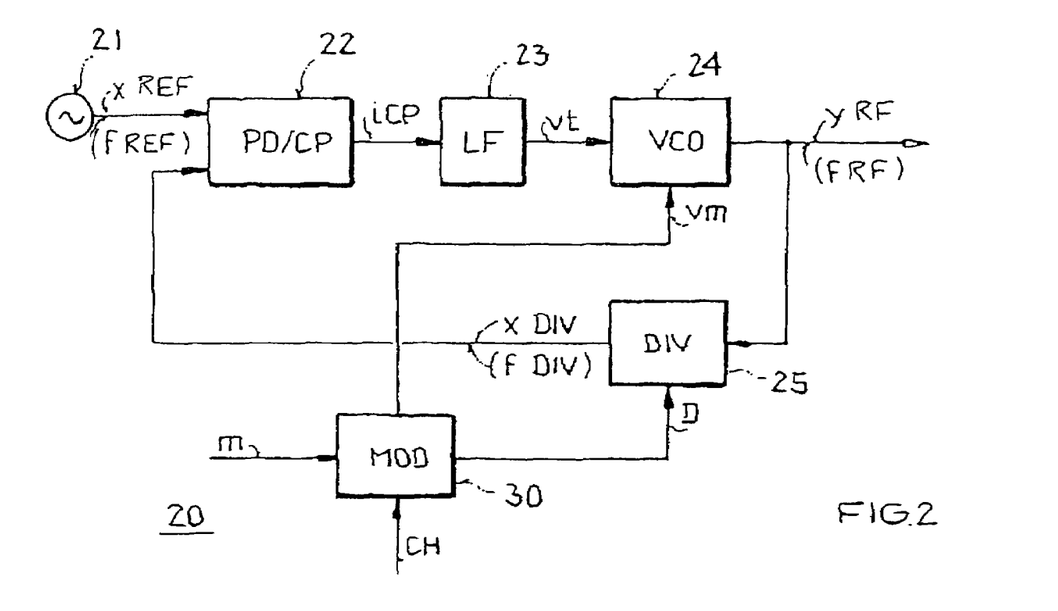
FIG. 2 illustrates an exemplary embodiment of an inventive frequency modulator.

FIG. 2 shows a block diagram of an inventive frequency modulator. The frequency modulator 20 generates an output signal yRF, which may be amplified under certain circumstances, that has an (instantaneous) frequency fRF dependent on a modulation signal m and a desired channel in the ISM band, wherein the modulation signal m can, in general, assume N, but at least two, different discrete modulation values m0, m1, . . . . Each modulation value here is associated with a predefined (target) frequency value f0, f1, . . . of the output signal yRF. Finally, the output signal yRF is amplified by a power amplifier and radiated through the antenna (not shown in FIG. 2).

In the event of a frequency modulator for a transmitting unit 15 from FIG. 1, according to IEEE 802.15.4 the modulation signal has precoded chips of the consecutive PN sequences present at a chip clock rate of fC=2 Mchip/s, where each of the precoded chips can take on a binary value of (logic) zero or one. Thus, in this case the modulation signal m has two different modulation values m0=0 and m1=1. At a modulation value of zero (m0), the (instantaneous) frequency fRF of the VCO output signal yRF should assume the frequency value f0, for example, while a modulation value of one (m1) should result in the frequency value f1. The following applies here:

$$f0 = fCH - \Delta F \text{ and } f1 = fCH + \Delta F, \quad (1)$$

where fCH represents the center frequency of the desired channel in the ISM band and Δf represents the MSK frequency swing Δf=fC/4=0.5 MHz.

As shown in FIG. 2, the frequency modulator 20 has a reference oscillator 21, a phase locked loop (PLL) 22-25, and a modulation unit (MOD) 30.

The phase locked loop 22-25 includes a phase (difference) detector/charge pump (PD/CP) 22, a loop filter (LF) 23, a voltage controlled oscillator (VCO) 24 for generating the output signal yRF, and a switchable frequency divider (DIV) 25 for deriving the frequency-divided signal xDIV. The phase locked loop 22-25 is closed ("closed loop"), which is to say that unlike so-called "open loop" modulators, it is not opened even during the time segments when active modulation is taking place.

The modulation signal m and a quantity associated with the center frequency fCH of the desired channel, such as an index CH of the desired channel, is fed to the modulation unit (MOD) 30.

The functional blocks 21-25 and 30 are described in greater detail below.

The reference oscillator 21 generates a reference signal xREF, which may be amplified under certain circumstances, that has a reference frequency fREF of, for example, 16 MHz and is configured as a quartz oscillator or as a voltage controlled quartz oscillator, for example.

The PD/CP unit 22 has two inputs connected to the reference oscillator 21 or the frequency divider 25. The PD/CP unit determines the phase deviation (phase difference) between the reference signal xREF of the reference oscillator 21 and the frequency-divided signal xDIV of the frequency divider 25, and provides at its output a defined current iCP as a function of the phase difference. A phase frequency detector may also be provided in place of the phase detector.

The loop filter (LF) 23 has an input connected to the PD/CP unit 22, and an output connected to the VCO 24. As a function of the current iCP present at the input, the loop filter 23 generates a first control voltage vt and makes this available at its output.

As a function of the modulation signal m and the index CH, the modulation unit (MOD) 30 determines values of a divisor D and makes these available at a first output. In addition, the modulation unit 30 generates a second control voltage vm as a function of the modulation signal m and makes this available at a second output.

The voltage controlled oscillator (VCO) 24 has a first input connected to the loop filter 23, a second control input connected to the second output of the modulation unit 30, and an output connected to the frequency divider 25. As a function of the first control voltage vt present at the first control input and also of the second control voltage vm present at the second control output, the VCO 24 generates the output signal yRF, which may be amplified under certain circumstances.

The switchable frequency divider (DIV) 25 has a signal input connected to the VCO 24 and has a control input connected to the first output of the modulation unit 30. The frequency divider 25 derives, from the VCO output signal yRF, a frequency-divided signal xDIV whose instantaneous frequency fDIV depends upon the then-current value of the divisor D present at its control input, and makes the frequency-divided signal available at its output. In frequency division, the frequency fRF of the VCO output yRF is divided by a divisor D dependent upon the index CH of the desired channel and upon the current value of the modulation signal m, so that the following relationship holds for the frequency fDIV of the frequency-divided signal xDIV:

$$fDIV = fRF/D. \quad (2)$$

From the minimum and maximum possible frequency values $$f0\min = fCH\min - \Delta F = (2405 - 0.5) \text{ MHz} = 2404.5 \text{ MHz}$$
$$\text{or} \quad (3a)$$

$$f1\max = fCH\max + \Delta F = (2480 + 0.5) \text{ MHz} = 2480.5 \text{ MHz} \quad (3b)$$

for the frequency fRF and the above-mentioned reference frequency of, for example, fREF=16 MHz, the smallest and largest divisor values of 150.28125 and 155.03125, respectively, are obtained.

In order to realize such non-integer divisor values, the frequency divider 25 is designed to be switchable, wherein it performs frequency division with different integer divisor values D at different times in such a manner that the required non-integer divisor value results "on average" when viewed over a certain time interval. Phase locked loops with such a switchable frequency divider are called "fractional-N PLL."

Preferably, the frequency divider 25 is implemented as what is known as a multi modulus divider (MMD), which is to say as a digital counter that is programmable in its counting range. In advantageous fashion, the MMD has two frequency dividers, wherein the first is called a prescaler and is designed to undertake frequency divisions by K or K+1, and the second operates with a customary fixed division ratio and controls the modulus input of the prescaler as a function of the divisor D present at the control input.

In order to compensate for the phase error caused by the variation of the divisor values between the frequency-divided signal xDIV and the reference signal xREF, the phase locked loop can advantageously have a switchable delay unit between the frequency divider 25 and the PD/CP unit 22.

Instead of a fractional-N phase locked loop, it is also possible to provide a so-called "integer-N" PLL in the event of suitable ratios of the target frequency values and reference frequency. The invention is not limited to a specific PLL architecture in this regard.

Figure 3:
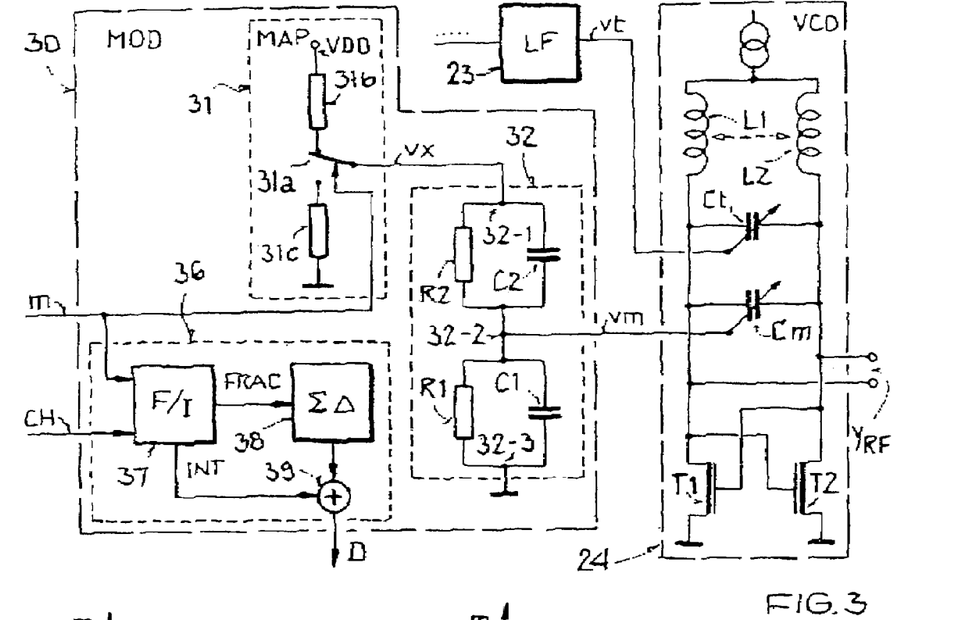
FIG. 3 illustrates a first embodiment of an inventive modulation unit.

FIG. 3 shows a detail of a schematic diagram of an inventive frequency modulator. In particular, FIG. 3 shows a preferred first embodiment of the modulation unit 30, and also schematically shows an exemplary VCO 24.

The VCO 24 has a resonant circuit for producing an oscillation, and has an amplifier for deattenuation of this oscillation. The VCO also includes a first control input to be supplied with the first control voltage vt provided by the loop filter 23, a second control input to be supplied with the second control voltage vm generated by the modulation unit 30, and a differential output for providing the output signal yRF.

By way of example, the amplifier includes two cross-coupled field-effect transistors (FET) T1, T2.

The resonant circuit contains two inductors L1, L2 and two parallel-connected capacitive elements Ct, Cm, whose combined component values determine the frequency of the oscillation. In order to adjust the frequency fRF of the output signal yRF to the predetermined (target) frequency value, the elements Ct, Cm each have an adjustable capacitance value, wherein the capacitance value of the first capacitive element Ct is adjusted by means of the first control voltage vt and the capacitance value of the second capacitive element Cm is adjusted on the basis of the second control voltage vm. The capacitive elements Ct, Cm are preferably configured as varactors, variable-capacitance diodes, or the like.

It is preferable if the VCO is designed to convert the first and second control voltages vt, vm to a frequency fRF of the output signal yRF with mutually different slopes K1 and K2, wherein the slope K2 of the conversion of the second control voltage vm is customarily smaller than the slope K1 of the conversion of the first control voltage vt.

Components for adjusting operating points, coupling capacitors, etc., are not shown in the VCO 24 in order to simplify the representation of the example.

The modulation unit 30 has a conversion unit (MAP) 31, a voltage divider 32, and a divisor selection unit 36.

The voltage divider 32 has a high point 32-1, a center tap 32-2, and a reference point 32-3, wherein the center tap 32-2 is connected to the second output of the modulation unit 30 in order to provide the second control voltage vm, while the high point 32-1 is connected to the output of the conversion unit 31, and the reference point is at a reference voltage such as ground, for example.

Located between the center tap 32-2 and the reference point 32-3 of the voltage divider is a parallel circuit composed of a first capacitive element C1 and a first resistive element R1, while a parallel circuit composed of a second capacitive element C2 and a second resistive element R2 is located between the center tap 32-2 and the high point 32-1.

The capacitive elements C1, C2 constitute a capacitive voltage divider, while the resistive elements R1, R2 form a resistive voltage divider that is connected in parallel thereto, wherein the capacitive and resistive voltage dividers have a common center tap 32-2, a common high point 32-1, and a common reference point 32-3.

The first capacitive element C1 is a purely or partly parasitic capacitance. The second capacitive element C2 (and, if applicable, the nonparasitic component of the first capacitive element C1) is preferably implemented as an MIM (metal-insulator-metal) capacitor.

Preferably, the components of the voltage divider are chosen such that the ratio R1/C1'=R2/C2 applies. In this connection, C1' includes all parasitic and effective capacitances at the center tap 32-2, so that the frequency-determining capacitance Cm of the VCO 24 is also taken into account.

In order to supply the capacitance Cm with a bias voltage, preferably an additional, third resistive element R3—not shown in FIG. 3—is provided between the center tap 32-2 and a terminal of the supply voltage VDD, forming a voltage divider with the first resistive element R1.

The first resistive element R1, the first capacitive element C1, and if applicable the third resistive element R3, can each advantageously have an adjustable value. In this way, the modulation index or frequency swing $\Delta F$ can be adjusted or calibrated in advantageous fashion.

The conversion unit (MAP) 31, to whose input the modulation signal m is supplied, is connected at its output to the high point 32-1 of the voltage divider 32. The conversion unit 31 converts the modulation signal m into a control signal vx in that a predefined voltage value vx0, vx1, . . . is associated with each different modulation value (m0, m1, . . . ), and the particular predefined voltage value that is associated with the applicable current value of the modulation signal m is applied to the high point 32-1 of the voltage divider 32.

In the case considered here of a two-valued (N=2) modulation signal m, the conversion unit 31 preferably has a switching unit 31a, which is designed to connect the output of the conversion unit either to the supply voltage VDD or to a reference voltage (e.g., ground) (through a resistor 31b or 31c as applicable in each case) as a function of the applicable current value of the modulation signal. For example, the output of the conversion unit 31 is connected to the supply voltage VDD in the event that the modulation signal currently assumes the value m0, and is connected to the reference voltage in the event that the modulation signal currently assumes the value m1.

At higher-valued modulation signals m with N>2 different modulation values, preferably N equidistant voltage values are provided by the conversion unit 31. In the event of N=4 the four voltage values VDD, ($\frac{2}{3}$)*VDD, VDD/3 and 0V (ground) can be provided, for example, if the modulation signal currently takes on the value m0, m1, m2 or m3.

The exemplary divisor selection unit 36 shown in FIG. 3 has an F/I unit 37, a sigma-delta modulator 38, and an adder 39. The modulation signal m and the index CH of the desired channel are supplied to both inputs of the F/I unit 37, while the output of the adder 39 is connected to the control input of the frequency divider 25 through the first output of the modulation unit 30. On the input side, the adder 39 is connected to the first output of the F/I unit 37 and to the output of the sigma-delta modulator 38, which in turn is connected to the second output of the F/I unit 37.

The F/I unit 37 uses the index CH of the desired channel and the current value of the modulation signal m to determine a first value INT and a second value FRAC. In this context, the two integer values INT and FRAC specify, in multiples of fREF=16 MHz or ΔF=0.5 MHz=fREF/32, the frequency offset that must be added to a base frequency of 2304 MHz in order to achieve the desired target frequency f0 or f1 in consideration of the CH value and current modulation value. The values INT and FRAC are thus chosen such that the value $$2304\text{ MHz} + INT*16\text{ MHz} + FRAC*0.5\text{ MHz} \quad (4)$$

results in the desired target frequency f0 (for m0) or f1 (for m1). Depending on the channel index CH and the modulation value, the quantities INT and FRAC can take on values in the range of 6 to 11 and from 0 to 31. The F/I unit 37 is preferably implemented as a lookup table.

In the simplest case of a first-order sigma-delta modulator, the sigma-delta modulator 38, to which the value FRAC is supplied, determines a higher-rate (e.g., 8*fC) sequence of zeros and ones whose relative frequency reflects the FRAC value. Thus, for example, the value FRAC=16, which stands for a frequency offset of $^{16}/_{32}*\text{fREF}=\frac{1}{2}*\text{fREF}$, results in a sequence of equal numbers of zeros and ones. Instead of two-valued sequences of zeros and ones, higher-valued sequences, e.g., with integer values between −1 and 2, can be produced with the aid of a higher-order sigma-delta modulator.

Finally, the values generated by the sigma-delta modulator 38 are added to the INT value in the adder 39, and the sum values are supplied to the frequency divider 25. With the aid of these sum values, the frequency divider 25 implements the frequency division by the required divisor D.

The exemplary divisor selection unit 36 shown in FIG. 3 can alternatively be implemented in other ways as well, in particular without a sigma-delta modulator, but instead using an accumulator. Moreover, other implementations of the VCO 24 may be provided as well.

The inventive frequency modulator explained above on the basis of FIGS. 2 and 3 is especially simple to realize and operates in an energy-saving manner. Furthermore, it is robust with regard to tolerances within the phase locked loop, which can be caused by fluctuations in the temperature or supply voltage, or by process variations. These advantages apply both to the case of a two-valued modulation signal m and to the case of higher-valued modulation signals (N>2).

Figure 4:
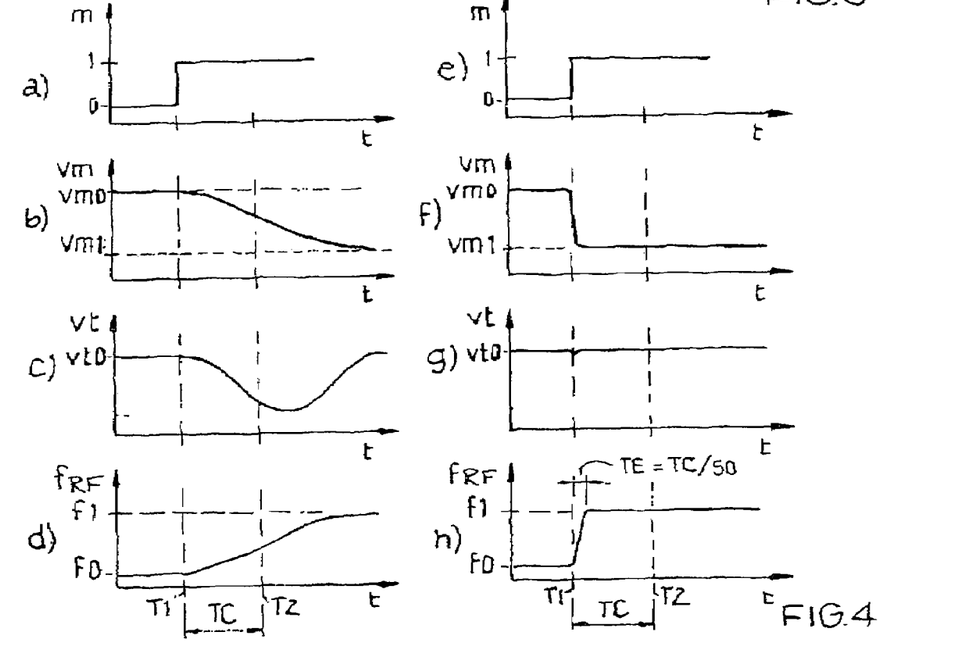
FIG. 4 illustrates time curves of the modulation signal, the VCO control voltages, and the frequency of the VCO output signal.

FIG. 4 schematically shows example time curves of the modulation signal m, the VCO control voltages vm, vt, and the frequency fRF of the output signal yRF in a frequency modulator without (FIG. 4a-d) or with (FIG. 4e-h) an inventive modulation unit.

As is evident from FIGS. 4a and 4e, in the illustrated case the two-valued modulation signal m assumes the value m0=0 up to the time t=T1, between times T1 and T2 the value m1=1, and subsequently the value m1=1 once more. In this context, the (target) frequency f0 of the VCO output signal yRF is associated by way of example with the modulation value m0, while the modulation value m1 should produce the frequency f1.

For a frequency modulator as shown in FIG. 2 with an inventive modulation unit as in FIG. 3, the FIGS. 4f-h show the time behavior of the VCO control voltages vm and vt, and the time behavior of the instantaneous frequency fRF of the resultant VCO output signal yRF. Solely for the purpose of illustrating the invention's principle of operation, the FIGS. 4b-d show the curves of these quantities for a hypothetical frequency modulator as shown in FIG. 2 with a modulation unit that does not have a capacitive voltage divider.

As is evident from FIGS. 4b, 4f, and 4c, 4g, the VCO control voltages vm and vt initially (t<T1) assume a constant voltage value vm0 or vt0. As shown in FIG. 4d, 4h, these voltage values vm0, vt0 produce at the VCO output an output signal yRF with the frequency f0, which, in accordance with the above-described assumption, is associated with the modulation value m0=0. In this condition, the phase locked loop is in a steady state. In the inventive modulation unit 30 from FIG. 3, the switching element 31a of the conversion unit 31 initially (t<T1) is located in the upper position, so that the operating voltage (vx=vx0=VDD) is present at the high point 32-1 of the voltage divider 32, and the capacitor C2 is in the charged condition.

At the time t=T1, when according to FIG. 4a the modulation signal m switches from the modulation value zero to the value 1, a transient process of the VCO control voltage vm from the value vm0 to the voltage value vm1 begins in accordance with FIG. 4b. The time constant of this transient process depends, in particular, on the resistances connected to the second control input of the VCO and on parasitic capacitances at this control input. As is evident from FIG. 4b, this transient process takes a time period whose length significantly exceeds a chip period TC=500 ns, so that the voltage value vm1 is not achieved at the time t=T1+TC=T2.

Due to the changing value of the modulation signal m at the time t=T1, changed divisor values D result for the frequency division by the switchable frequency divider 25 from FIG. 2. Each change in the divisor value D leads to a non-negligible phase difference between the resultant, changed, frequency-divided signal xDIV and the reference signal xREF, which is subsequently regulated out by the phase locked loop. This produces a curve of the control voltage vt provided by the loop filter as shown in FIG. 4c. Initially, the control voltage vt drops, in order to compensate the initially large deviation of the control voltage vm from the required voltage value vm1 (see FIG. 4b). As the deviation between vm and vm1 decreases, the control voltage vt reaches a minimum value and then rises until it again achieves its original value vt0 when the transient process of the control voltage vm has concluded.

It is evident from FIG. 4d that the instantaneous frequency fRF of the VCO output signal yRF exhibits transient behavior resembling that of the control voltage vm in terms of the time it takes. Although the frequency fRF rises slowly starting at the time t=T1, it does not reach the target value f1 until significantly after the time t=T2. Because of this slow frequency change, the instantaneous frequency fRF at the time t=T2 is between f0 and f1.

Simulations carried out by the applicant have shown that, under realistic assumptions, the transient processes described here are significantly longer than a chip period TC (typically: 4*TC ... 10*TC=2 ... 5 μs) so that at the end of the respective chip period, the frequency fRF does not reach the required value of f0 or f1. The duration of transient processes here depends primarily on the cutoff frequency of the closed phase locked loop, which in turn depends primarily on the steepness of the output frequency/control voltage characteristic curves of the VCO, the transfer function of the loop filter, the current provided by the charge pump, the divisor value of the frequency division, and the value of the reference frequency. This state of affairs causes a de facto limitation of the rate of the modulation signal m to a value significantly below the cutoff frequency of the phase locked loop, so that a frequency modulator without the inventive modulation unit cannot be used in the application considered here.

With the aid of the capacitive voltage divider C1, C2, a defined current is removed from or added (supplied) to the center tap 32-2 in FIG. 3, wherein the current is dimensioned such that the transient processes described above are significantly shortened. According to the invention, the defined current flows in through the second capacitive element C2 to the center tap 32-2 (in the upper setting of the switching element 31a from FIG. 3), or flows out from the center tap 32-2 through the second capacitive element C2 (in the lower setting of the switching element 31a). This significantly shortens the transient process of the control voltage vm, as is evident from FIG. 4f, where the control voltage vm drops to the voltage value vm1 during a very short time interval after the time t=T1, when the switching element 31a switches from the upper setting to the lower setting.

Since both the conversion unit 31 and the divisor selection unit 36 are controlled at any given time by the applicable current value of the modulation signal m, the transient process of the control voltage vm takes place practically immediately, i.e. essentially simultaneously with the change in the divisor value resulting from the applicable "new" (current) modulation value. Consequently, almost no phase difference arises which must be regulated out by the phase locked loop. For this reason, the control voltage vm deviates slightly at most from the voltage value vt0 during the short transient process, as is evident from FIG. 4g.

The frequency fRF likewise exhibits a very rapid transient behavior, as can be seen from FIG. 4h. Essentially simultaneously with the change in the divisor value and the transient process of vm, the instantaneous frequency fRF rises from the frequency value f0 to the frequency value f1 within a very short time period TE of approximately TC/50=10 ns after the time t=T1. Such rapid frequency changes are necessary especially in the case of unfiltered modulation types such as the MSK modulation considered here, and improve the signal quality (signal-to-noise ratio) of the transmit signal, and thus the performance of the receiver's data detection (error probability) and the range.

It is evident from the above description that the values of the capacitive elements C1, C2 of the capacitive voltage divider and the voltage values vx0, vx1 at the high point 32-1 of the capacitive voltage divider are selected such that, during a time period TE that is significantly shorter than the time period TC of the modulation value, the control voltage vm for each modulation value (m0, m1) adjusts itself to the particular voltage value (vm0, vm1) that results in the predefined frequency value (f0, f1) of the output signal yRF that is associated with the modulation value.

In this context, the duration of the time period TE, which is to say the remaining settling time, depends on process tolerances of the values of the individual components during manufacture, fluctuations in values due to temperature and/or aging influences, and variations in the operating voltage, among other factors.

In the case of higher-valued modulation signals with N>2 different modulation values, the values of the capacitive elements C1, C2 and the N voltage values vx0, vx1, . . . at the high point 32-1 are chosen such that, during a time period TE that is shorter than the time period TC of the modulation value, the control voltage vm for each of the N modulation values (m0, m1, . . . ) adjusts itself to the particular voltage value vm0, vm1, . . . of the N voltage values that results in the particular predefined frequency value f0, f1, . . . of the N predetermined frequency values associated with the modulation value.

Figure 5:
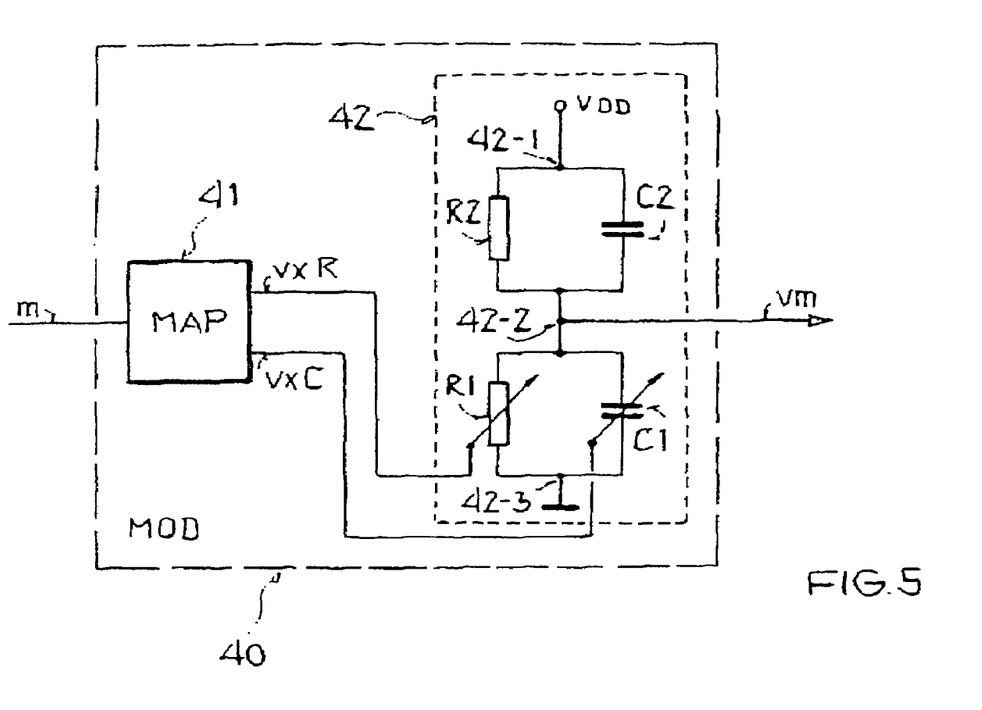
FIG. 5 illustrates a second embodiment of an inventive modulation unit.

FIG. 5 shows a second embodiment of the modulation unit. Analogously to the first embodiment described in detail above with reference to FIG. 3, the modulation unit, which here is labeled with the reference number 40, again includes a conversion unit (41), a voltage divider (42), and a divisor selection unit that is not shown. The voltage divider 42 has first and second capacitive and resistive elements R1, R2, C1, C2, which are connected in conformity with FIG. 3 and the above description.

In contrast to the first embodiment, here the high point 42-1 of the voltage divider 42 is positioned at a fixed voltage, for example the supply voltage VDD. Furthermore, the first capacitive element C1 has an adjustable capacitance value and the first resistive element R1 has an adjustable resistance value. The voltage values required for adjusting these values are generated by the conversion unit 41 as a function of the modulation signal m. In this context, a predetermined voltage value vxC0 or vxC1 for the first capacitive element C1, and a predetermined voltage value vxR0 or vxR1 for the first resistive element R1, are associated with each different modulation value (m0, m1) and are applied to the control input of the applicable element.

The capacitive element C1 preferably has connected MIM capacitors or is designed as a CDAC (capacitive digital-to-analog converter), while the resistive element R1 preferably has connected resistors.

In a third embodiment of the modulation unit, only the second capacitive and resistive elements C2, R2 have adjustable values, while the first capacitive and resistive elements C1, R1 have fixed values.

In a fourth embodiment of the modulation unit, both the first and the second capacitive and resistive elements C1, R1, C2, R2 have adjustable values. In this case, the conversion unit generates a total of 4 voltage values as a function of the modulation signal m.

In each of the second, third, and fourth embodiments of the modulation unit, the values of the components of the voltage divider 42 are adjusted or selected and the voltage value at the high point 42-1 of the voltage divider 42 is selected such that, during a time period TE that is shorter than the time period TC of the modulation value, the control voltage vm for each modulation value (m0, m1) adjusts itself to the particular voltage value (vm0, vm1) that results in the particular predefined frequency value (f0, f1) of the output signal yRF that is associated with the modulation value. The second control voltage vm described in detail above with reference to FIGS. 3 and 4 then results at the center tap of the voltage divider.

Again, this then applies analogously also for higher-valued modulation signals m with N>2 different modulation values.

The inventive frequency modulators with the second through fourth embodiments explained above are simple to realize, and operate in an energy-saving manner. Moreover, they are robust with regard to tolerances within the phase locked loop.

Even though the present invention has been described above on the basis of example embodiments, it is not restricted thereto, but can instead be modified in multiple ways. Thus, for example, the invention is neither restricted to WPANs per se, nor to WPANs per IEEE 802.15.4, nor to the modulation type (offset QPSK or MSK with two-valued modulation), frequency bands and values, modulation rate, etc., specified therein. Likewise, the invention is also not limited to a specific reference frequency, frequency resolution, data rate, or a specific architecture of the PLL ("fractional N"), architecture of the loop filter, architecture of the VCO, architecture of the frequency divider, architecture of the conversion unit, or architecture of the divisor selection unit.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A frequency modulator for generating an output signal with a frequency that is a function of a modulation signal, wherein the modulation signal assumes $N \geq 2$ different discrete modulation values and a predetermined frequency value of the output signal is associated with each modulation value, the frequency modulator comprising:
a closed phase locked loop with a loop filter for providing a first control voltage;
a voltage controlled oscillator for generating the output signal;
a switchable frequency divider for deriving a frequency-divided signal;
a modulation unit that provides, at a first output, values of a divisor that are a function of the modulation signal, and, at a second output, a second control voltage that is a function of the modulation signal,
wherein the oscillator has a first control input connected to the loop filter and has a second control input connected to the second output of the modulation unit, and generates the output signal as a function of the first control voltage and the second control voltage,
wherein the frequency divider is operatively connected to the first output of the modulation unit and derives the frequency-divided signal so manner that it has substantially instantaneous frequencies that are a function of the divisor values, and
wherein the modulation unit has a capacitive voltage divider with a center tap and provides the second control voltage at the center tap.

2. The frequency modulator according to claim 1, wherein the modulation unit has an input to be supplied with the modulation signal, which input is connected to the capacitive voltage divider.

3. The frequency modulator according to claim 1, wherein the modulation unit has a resistive voltage divider whose center tap is connected to the center tap of the capacitive voltage divider.

4. The frequency modulator according to claim 3, wherein the capacitive voltage divider and the resistive voltage divider each have a high point that is at the same voltage.

5. The frequency modulator according to claim 1, wherein the capacitive voltage divider has a first capacitive element located between the center tap and a reference point, and a second capacitive element located between the center tap and a high point of the capacitive voltage divider.

6. The frequency modulator according to claim 5, wherein the first capacitive element is a parasitic capacitor.

7. The frequency modulator according to claim 5, wherein a first resistive element is connected in parallel to the first capacitive element and a second resistive element is connected in parallel to the second capacitive element.

8. The frequency modulator according to claim 7, wherein the first capacitive and first resistive element and/or the second capacitive and second resistive element have an adjustable value and the modulation unit has a conversion unit that is adjusts the adjustable values as a function of the then-current value of the modulation signal.

9. The frequency modulator according to claim 1, wherein the modulation unit has, connected to a high point of the capacitive voltage divider, a conversion unit that associates a predefined voltage value with each modulation value, and to apply to the high point the particular voltage value that is associated with the applicable current value of the modulation signal.

10. The frequency modulator according to claim 1, wherein the modulation unit adjusts the second control voltage for each modulation value in a first time period that is shorter than the duration of the modulation value to the particular voltage value that leads to the particular predefined frequency value of the output signal associated with the modulation value.

11. The frequency modulator according to claim 1, wherein the modulation unit adds to or removes from the center tap a defined current that is dimensioned such that the second control voltage is set in a first time period that is shorter than the duration of the modulation value to the particular voltage value that leads to the particular predefined frequency value of the output signal associated with the modulation value.

12. The frequency modulator according to claim 1, wherein the modulation unit associates at least one voltage value with each of the N modulation values and provides the voltage value(s) that correspond(s) to the applicable current value of the modulation signal m.

13. The frequency modulator according to claim 1, wherein the oscillator has a first and a second frequency-determining capacitive element with an adjustable first or second capacitance value and the frequency modulator adjusts the first capacitance value on the basis of the first control voltage and adjusts the second capacitance value on the basis of the second control voltage.

14. The frequency modulator according to claim 13, wherein the second frequency-determining capacitive element is connected in parallel to the first frequency-determining capacitive element.

15. The frequency modulator according to claim 1, wherein the oscillator converts the first and second control voltages with mutually different slopes.

16. The frequency modulator according to claim 1, wherein the phase locked loop has a phase detector that is connected to the frequency divider and the loop filter and determines the phase difference between a reference signal and the frequency-divided signal.

17. The frequency modulator according to claim 1, wherein the frequency modulator is designed to carry out unfiltered modulation.

18. The frequency modulator according to claim 1, wherein the rate of the modulation signal exceeds the cutoff frequency of the closed phase locked loop.

19. A transmitting/receiving device for a data transmission system based on IEEE Standard 802.15.4, the transmitting/receiving device comprising: an antenna; a transmitting unit connected to the antenna for transmitting data per IEEE Standard 802.15.4; and a frequency modulator according to claim 1.

20. An integrated circuit for a transmitting/receiving device according to claim 19, having a frequency modulator according to claim 1.

* * * * *